United States Patent
Krivec (10) Patent No.: US 12,048,089 B2
(45) Date of Patent: *Jul. 23, 2024

(54) LAMINATED COMPONENT CARRIER WITH A THERMOPLASTIC STRUCTURE

(71) Applicant: AT&S Austria Technologie & Systemtechnik Aktiengesellschaft, Leoben (AT)

(72) Inventor: Thomas Krivec, Zeltweg (AT)

(73) Assignee: AT&S Austria Technologie & Systemtechnik, Leoben (AT)

( * ) Notice: Subject to any disclaimer, the term of this patent is extended or adjusted under 35 U.S.C. 154(b) by 0 days.

This patent is subject to a terminal disclaimer.

(21) Appl. No.: 18/045,376

(22) Filed: Oct. 10, 2022

(65) Prior Publication Data

US 2023/0054846 A1    Feb. 23, 2023

Related U.S. Application Data

(63) Continuation of application No. 16/090,220, filed as application No. PCT/EP2017/057542 on Mar. 30, 2017, now Pat. No. 11,483,923.

(30) Foreign Application Priority Data

Mar. 30, 2016    (DE) .......................... 102016105737.1

(51) Int. Cl.
*H05K 1/02*    (2006.01)
*H05K 1/18*    (2006.01)
(Continued)

(52) U.S. Cl.
CPC ........... *H05K 1/0278* (2013.01); *H05K 1/181* (2013.01); *H05K 3/0014* (2013.01);
(Continued)

(58) Field of Classification Search
CPC .... H05K 1/0278; H05K 1/181; H05K 3/0014; H05K 3/4655; H05K 3/4688;
(Continued)

(56) References Cited

U.S. PATENT DOCUMENTS 3,907,717 A    9/1975    Hebert
5,008,496 A    4/1991    Schmidt et al.
(Continued)

FOREIGN PATENT DOCUMENTS

CN    101431857 A    5/2009
CN    102159021 A    8/2011
(Continued)

OTHER PUBLICATIONS

English Translation of Office Action in Application No. 201780026834.1; pp. 1-7; Mar. 3, 2022; China National Intellectual Property Administration; No. 6, Xitucheng Lu, Jimenqiao Haidian District, Beijing City, 100088, China.
(Continued)

*Primary Examiner* — Ishwarbhai B Patel
(74) *Attorney, Agent, or Firm* — Robert A. Blaha; Smith Tempel Blaha LLC (57) ABSTRACT

A component carrier for carrying at least one electronic component includes (a) a plurality of electrically conductive layers; (b) a plurality of electrically insulating layers; and (c) a thermoplastic structure. The electrically conductive layers, the electrically insulating layers, and the thermoplastic structure form a laminate. Further, a method for manufacturing such a component carrier and an electronic apparatus including such a component carrier are provided.

14 Claims, 4 Drawing Sheets

(51) Int. Cl.
*H05K 3/00* (2006.01)
*H05K 3/46* (2006.01)
*H05K 1/03* (2006.01)
*H05K 1/11* (2006.01)

(52) U.S. Cl.
CPC ......... *H05K 3/4655* (2013.01); *H05K 3/4688* (2013.01); *H05K 3/4691* (2013.01); *H01L 2224/16227* (2013.01); *H01L 2924/15192* (2013.01); *H01L 2924/15313* (2013.01); *H01L 2924/19105* (2013.01); *H05K 1/0284* (2013.01); *H05K 1/036* (2013.01); *H05K 1/11* (2013.01); *H05K 2201/0129* (2013.01); *H05K 2203/1105* (2013.01); *H05K 2203/302* (2013.01)

(58) Field of Classification Search
CPC .... H05K 3/4691; H05K 1/0284; H05K 1/036; H05K 1/11; H05K 2201/0129; H05K 2203/1105; H05K 2203/302; H01L 2224/16227; H01L 2924/15192; H01L 2924/15313; H01L 2924/19105; Y02P 70/50
See application file for complete search history.

(56) References Cited

U.S. PATENT DOCUMENTS

| | | | |
|---|---|---|---|
| 5,220,488 | A | 6/1993 | Denes |
| 5,585,437 | A * | 12/1996 | Ohmae ................ C08L 101/00 525/397 |
| 5,715,140 | A | 2/1998 | Sinkunas et al. |
| 5,996,222 | A | 12/1999 | Shangguan et al. |
| 6,284,998 | B1 | 9/2001 | Sinkunas et al. |
| 6,447,880 | B1 | 9/2002 | Coppens |
| 8,592,686 | B2 | 11/2013 | Kobayashi et al. |
| 8,809,689 | B2 | 8/2014 | Olden et al. |
| 8,999,200 | B2 * | 4/2015 | Bandyopadhyay ...... C08K 3/04 252/502 |
| 9,502,151 | B2 | 11/2016 | Li et al. |
| 10,244,624 | B2 | 3/2019 | Michiwaki |
| 11,483,923 | B2 * | 10/2022 | Krivec ................ H05K 3/0014 |
| 2002/0140076 | A1 | 10/2002 | Yamazaki et al. |
| 2006/0049495 | A1 | 3/2006 | Hazeyama et al. |
| 2006/0180344 | A1 | 8/2006 | Ito et al. |
| 2008/0118681 | A1 | 5/2008 | Ueno |
| 2009/0181239 | A1 * | 7/2009 | Fan ........................ B29C 43/203 156/60 |
| 2009/0314523 | A1 | 12/2009 | Ito et al. |
| 2011/0067904 | A1 | 3/2011 | Aoyama et al. |
| 2011/0198111 | A1 | 8/2011 | Naganuma et al. |
| 2011/0210407 | A1 | 9/2011 | Katayama et al. |
| 2012/0186860 | A1 | 7/2012 | Takaoka |
| 2013/0014982 | A1 | 1/2013 | Segawa et al. |
| 2013/0092426 | A1 * | 4/2013 | Wu .......................... C09J 7/385 174/257 |
| 2015/0195921 | A1 * | 7/2015 | Onodera ............... H05K 3/4691 174/258 |
| 2015/0359091 | A1 * | 12/2015 | Mahler ................. H05K 3/0014 29/829 |
| 2016/0066429 | A1 | 3/2016 | Taniguchi et al. |
| 2016/0081193 | A1 | 3/2016 | Leggett et al. |
| 2019/0116664 | A1 | 4/2019 | Krivec |

FOREIGN PATENT DOCUMENTS

| | | |
|---|---|---|
| CN | 103947306 A | 7/2014 |
| CN | 204131835 U | 1/2015 |
| DE | 697 01 386 T2 | 7/2000 |
| DE | 103 09 188 A1 | 9/2003 |
| DE | 103 48 010 A1 | 4/2004 |
| DE | 10 2007 006 162 B3 | 6/2008 |
| EP | 0 358 937 A2 | 3/1990 |
| EP | 0 551 747 A1 | 7/1993 |
| JP | H0923052 A | 1/1997 |
| JP | 2006324574 A | 11/2006 |
| WO | 2004110114 A1 | 12/2004 |

OTHER PUBLICATIONS

Office Action in Application No. 201780026834.1; pp. 1-5; Mar. 3, 2022; China National Intellectual Property Administration; No. 6, Xitucheng Lu, Jimenqiao Haidian District, Beijing City, 100088, China.
Decision of Rejection; Mar. 3, 2022; pp. 1-5; China National Intellectual Property Administration; No. 6, Xitucheng Lu, Jimenqiao Haidian District, Beijing City, 100088, China.
Third Office Action in Application No. 201780026834.1; pp. 1-5; Oct. 9, 2021; China National Intellectual Property Administration; No. 6, Xitucheng Lu, Jimenqiao Haidian District, Beijing City, 100088, China.
English Translation of the cover page of the Third Office Action in Application No. 201780026834.1; pp. 1-3; Oct. 9, 2021; China National Intellectual Property Administration; No. 6, Xitucheng Lu, Jimenqiao Haidian District, Beijing City, 100088, China.
Xia, J. et al.; Multi-Sensors Data and Information Fusion Algorithm for Indoor Localization; Journal of Shanghai Normal University (Natural Sciences); vol. 44, No. 1; Feb. 2015; pp. 1-8; Shanghai, China.
Office Action in China Patent Application No. 201780026834.1; pp. 1-8; Aug. 6, 2020; China National Intellectual Property Administration; No. 6, Xitucheng Lu, Jimenqiao Haidian District, Beijing City, 100088, China.
Liu, H.; Search Report in China Patent Application No. 201780026834.1 (English Translation); pp. 1-2; Jul. 30, 2020; China National Intellectual Property Administration; Electrical Invention Examination Department of the Patent Examination Cooperation Jiangsu Center, China.
Office Action in China Patent Application No. 201780026834.1 (English Translation); pp. 1-8; Aug. 6, 2020; China National Intellectual Property Administration; No. 6, Xitucheng Lu, Jimenqiao Haidian District, Beijing City, 100088, China.
Linder, N.; International Preliminary Report on Patentability; pp. 1-10; Oct. 11, 2018; The International Bureau of WIPO 34, chemin des Colmbettes, 1211 Geneva 20, Switzerland.
Theunissen, L; International Search Report in PCT Application EP2017/057542; pp. 1-7; Aug. 7, 2017; European Patent Office, P.B. 5818 Patentlaan 2; 2280 HV Rijswijk, Netherlands.

* cited by examiner

LAMINATED COMPONENT CARRIER WITH A THERMOPLASTIC STRUCTURE

CROSS-REFERENCE TO RELATED APPLICATIONS

The present application is a continuation of U.S. patent application Ser. No. 16/090,220, filed on Sep. 29, 2018, which application was a national phase application based on PCT/EP2017/057542, filed on Mar. 30, 2017, which application claimed priority to German Patent Application No. 102016105737.1, filed Mar. 30, 2016, the disclosures of which applications are hereby incorporated herein by reference.

TECHNICAL FIELD

The present invention relates to the technical field of component carriers which are used as support structures for building up electronic assemblies (i.e., electronic circuits comprising one or more electronic components).

TECHNOLOGICAL BACKGROUND

A component carrier such as a Printed Circuit Boards (PCB) is a support structure for at least one electronic component forming an electronic assembly respectively an electronic circuit. Conductor traces representing an interconnecting wiring are formed from a thin metal layer comprising in particular copper. The conductor traces are formed by means of an appropriate structuring or patterning of the metal layer which is provided on top or beneath an insulating core structure.

The simplest type of component carrier comprises a resinous plastic core to which there is bonded one thin metal layer. The resinous plastic core can be clad also on both sides (upper side and lower side) with a metal layer. In order to increase the possible integration density for electronic assemblies also so called multi-layer component carriers are known which comprise, in a laminated structure an alternating sequence of at least three metal layers and two electrically insulating layers. Thereby, one electrically insulating layer is sandwiched in between two metal layers. By using appropriately structured inner metal layers and by providing metallic interconnects (so called vias) between different metal layers "third dimension" can be exploited for forming conductor traces.

Component carriers can also be made of flexible materials. This allows for an adaptation of the shape respectively of the three-dimensional design of a component carrier depending on the specific application. Component carriers can also comprise rigid and flexible portions. Such so called "rigid-flex" component carriers are a hybrid construction comprising at least one rigid and at least one a flexible portion which are laminated together into a single component carrier structure.

U.S. Pat. No. 8,592,686 discloses a method for manufacturing a printed circuit board assembled panel. Unit printed circuit boards previously manufactured are arranged in a frame in a prescribed relationship. Then, the printed circuit boards are fixed to one another, and the printed circuit board and the frame body are fixed to one another.

However, a proper spatial adaptation of a "rigid-flex" component carrier to a desired three dimensional shape is often a cumbersome procedure. This holds in particular if the final three-dimensional shape should be dimensionally stable.

SUMMARY

There may be a need for providing a component carrier which is spatially (de)formable and which, after forming the same, exhibits a dimensional stability.

This need may be met by the subject matter according to the independent claims. Advantageous embodiments of the present invention are described by the dependent claims.

According to a first aspect of the invention there is provided a component carrier for carrying at least one electronic component. The provided component carrier comprises (a) a plurality of electrically conductive layers; (b) a plurality of electrically insulating layers; and (c) a thermoplastic structure comprising a thermoplastic material. The electrically conductive layers, the electrically insulating layers, and the thermoplastic structure form a laminate.

According to an exemplary embodiment, the provided component carrier may be based on the idea that a laminated component carrier, e.g. a laminated printed circuit board for carrying a plurality of electronic components or a laminated substrate for carrying typically only one electronic component or only a small number of electronic components, can be easily produced in a traditional "flat" manner wherein flat layers, in particular flat prepreg layers, are attached to each other in order to form a layered stack. After having produced the layered stack the component carrier can be formed in an appropriate manner such that the 3D shape of the component carrier matches with the respective target application. In accordance with the basic characteristics of thermoplastic materials the 3D formation of the component carrier can be accomplished by applying thermal energy or heat at least to the thermoplastic structure. Thereby, a final 3D shape of the component carrier can be imposed from the respective thermal treatment.

The thermoplastic structure may comprise any thermoplastic material which allows, when being subjected to heat, to change its 3D shape without undergoing a structural damage. This may mean that after changing the 3D shape of the thermoplastic structure (and of the entire component carrier) there will be no cracks or other types of damages present in the thermoplastic structure.

A thermoplastic material may be a multiphase polymeric material which comprises amorphous sections and semi-crystalline sections. The thermoplastic material may become plastic and thus pliable and/or moldable above a specific temperature and the thermoplastic material solidifies upon cooling below that specific temperature. This process of liquefaction and solidification may be in general reversible as long as the applied heat (specific temperature) does not reach an upper degradation limit.

OVERVIEW OF EMBODIMENTS

Specifically, in the context of this document, the term "thermoplastic" may in particular imply that the thermoplastic material can be shaped by an application of heat. Therefore, materials that reach their degradation temperature before their melting temperature may not be considered as thermoplastic materials in this document.

It is mentioned that according to other broader definitions the term thermoplastic material may also be used for polymeric materials whose molecular chains are not chemically cured to each other in a temperature range until the upper degradation limit as it would be the case for thermosetting materials. This broader definition may also comprise materials which cannot be shaped by application of heat because their melting temperature is significantly higher than the upper degradation temperature limit such that these materials would be destroyed before they melt. This behavior can be observed for example for some of the Ultra-high Molecular Weight Polyethylene grades (PE-UHMW), Polytetrafluoroethylene grades (PTFE) and for many Polyimide types. Especially, this behavior may be relevant for the polyimide types which are commonly used for production of flexible PCBs (e.g., KAPTON® films, Kapton is a registered trademark of E. I. Du Pont De Nemours and Company, Wilmington, Delaware, U.S.A.).

Within the framework of a component carrier, in particular a so called multi-layer component carrier having (outer and inner metal layers) the thermoplastic structure may represent a dielectric layer or an electrically insulation layer which spatially separates two metal or electrically conductive layers which can be employed in a known manner in order to increase the possible integration density by exploiting appropriately patterned inner metal layers for forming conductor traces. Thereby, conductive vias may be used for (selectively) electrically connecting different (patterned) metal layers with each other.

In this document the term "prepreg" may particularly denote a "pre-impregnated" composite fiber matrix material which comprises a reactive resin. This reactive resin can be "activated" when at least a part of the laminate respectively of the entire layer structure of the component carrier is combined or adhered to each other by means of pressing the respective layers together, typically assisted by a thermal treatment (e.g. heating up the respective layers).

According to an embodiment of the invention the thermoplastic structure forms a core layer. This may provide the advantage that there is no need to use, apart from the thermoplastic structure, a material (layer) which provides for a certain mechanical stiffness of the component carrier.

In this document the term "core layer" may refer to any layer of the laminate which contributes most or at least significantly to the mechanical stiffness of the component carrier. Specifically, the stiffness of the (at least one) core layer is larger than the stiffness of each one or of all of the other layers of the component carrier laminate. The comparatively large stiffness may result from a large elastic modulus, e.g. the so called Young's modulus E, and/or from a large core layer thickness.

It is mentioned that the characteristic of the comparatively large stiffness of the thermoplastic structure may not be given during a 3D forming operation of the component carrier towards a desired shape. The thermoplastic structure may have its large stiffness only before and in particular after such a 3D forming operation which is carried out under high temperature.

According to a further embodiment of the invention the thermoplastic material is included in a composite layer structure. This may provide the advantage that the manufacturing of the described component carrier will be facilitated because the thermoplastic structure can be processed as at least a part of a semi-finished product. This holds in particular for those manufacturing steps which are accomplished when the component carrier still exhibits a planar or flat shape.

The composite layer structure may consist of only one material layer, i.e. the thermoplastic structure. However, the composite layer structure may also include at least one further layer, e.g. a metallic layer, adjacent to the thermoplastic structure.

It is mentioned that apart from the thermoplastic structure also other material layers can be formed, possibly in combination with at least one adjacent material layer, as a composite layer structure. This further facilitates the "flat" formation of the component carrier.

According to a further embodiment of the invention the thermoplastic structure is a core laminate comprising a layer of the thermoplastic material which is sandwiched by two electrically conductive layers.

The thermoplastic structure may be in particular a so called Copper Cladded Laminate (CCL). This means that two thin copper foils are laminated to the thermoplastic material layer, one copper foil at the top and the other copper foil at the bottom.

Using a CCL may provide the advantage that the described component carrier can be formed with a semi-finished product which facilitates the formation of the component carrier. Further, since copper is a metallic material which is very common for component carriers known and well established production procedure can be used for the formation of the component carrier. Further, at least one of the two copper foils may be used, when being patterned in an appropriate manner, as conductor traces for an electronic assembly which may be mounted to the component carrier.

According to a further embodiment of the invention the component carrier further comprises a thermosetting structure comprising a thermosetting material.

Using a combination of a thermoplastic material and a thermosetting material may result, after undergoing an appropriate shape forming, in a 3D shape which exhibits a large mechanical stability or stiffness. In particular, the final 3D shape may be a permanent shape.

In this document a thermosetting material may refer to a material which, when being subjected to heat, cures irreversibly. The thermosetting material may be a pre-polymer material. A cure may be induced by heat, generally above 200° C., by means of a chemical reaction and/or a suitable heat producing irradiation, in particular IR radiation. Once hardened the thermosetting material cannot be shaped differently by reheating.

The thermosetting material may preferably be a thermosetting material which is used for PCBs, i.e. a PCB material. In particular, the thermosetting material may be FR4.

According to a further embodiment of the invention the thermosetting structure is formed over and/or under the thermo-plastic structure and, with respect to a main plane being oriented parallel to the layers of the laminate, the thermosetting structure comprises a smaller size than the thermoplastic structure.

In other words, within the main plane there is at least one (exposed) portion wherein there is provided only the thermoplastic structure and not the thermosetting structure. Following the above described characteristics of thermoplastic and thermosetting materials this at least one portion can be used for bending the component carrier. Descriptive speaking, this at least one portion can act as a hinge allowing for a bending along a predefined line which is spatially defined by the (elongated) shape of the respective portion.

It is mentioned that when manufacturing the component carrier the thermosetting material can be applied directly or indirectly at the thermoplastic structure such that at an intermediate production step there is no portion being free of thermosetting material. At a later processing step the thermosetting material being assigned to the at least one portion can be removed. If applicable, a release layer, in particular a print release layer such as wax can be applied to those portions of the thermoplastic structure which should later be free from the thermosetting material.

According to a further embodiment of the invention the thermoplastic material is a semi-crystalline material or an amorphous material. This may provide the advantage that depending on the specific application a plurality of embodiments of the invention are possible which are given by a plurality of different types of thermoplastic material.

For providing a thermal induced flexibility a crystalline material has to be heated up to a temperature exceeding the respective melting temperature. In an application wherein for any reason parts of the component carrier should not be subjected to high temperatures a thermoplastic crystalline material with a comparatively low melting temperature $T_m$ should be selected.

For making an amorphous thermoplastic material flexible it is necessary to reach a temperature higher than the glass transition temperature $T_g$. Again, depending on the heat resistivity of the entire component carrier and/or of components being attached thereto, an amorphous thermoplastic material with a sufficiently low glass transition temperature $T_g$ should be selected.

In this document and in accordance with general technical terminology a semi-crystalline material is a material having a degree of crystallinity in a typically range between 10 and 80%. In the present case of polymers, within the ordered regions, the polymer chains are both aligned and folded. Ordered regions are considered as crystalline while the connecting regions between the crystalline areas are considered as amorphous. Thus the overall material is classified as semi-crystalline.

According to a further embodiment of the invention the thermoplastic material comprises at least one of the group consisting of Polyolefins such as Polypropylene (PP), Vinyl-Polymers such as PVC, Styrene based Polymers such as Polystyrene (PS), Polyacrylates such as Polymethylmetaclylate (PMMA), Polyacetals such as Polyoxymetlylene (POM), Fluoropolymers such as Polytetrafluoroethylene (PTFE), Polyamides including aromatic polyamides such as Polyphthalamide (PPA), Polycarbonate (PC) and Derivatives, Polyesters such as Polyethylene terephthalate (PET), Liquid Crystalline Polymers (LCP), Polyarylether such as Polyphenyleneether (PPE), Polyphenylenesulfone (PSU), Polyarylethersulfone (PES), Polyphenylensulfid (PPS), Polyetherketones such as Polyetheretherketone (PEEK), Polyimide (PI), Polyetherimide (PEI), Polyamidimide (PAI).

In this respect it is mentioned that the thermoplastic materials PEI, PES, and PSU and LCP may be of advantage because they a capable of withstanding temperatures up to 260° C. This means that these materials can be subjected to a typical reflow soldering process which usually is used in order to form a stable electric connection between the terminals of electronic components being assembled onto the component carrier and connection pads formed on the surface of the component carrier.

It has been experimentally proven by the inventors that in particular PEI can be processed in an easy and effective manner when it is existent within a fiber mesh material. This means that a thermoplastic reinforced fiber composite material is formed which can be used as a prepreg for realizing the described component carrier. However, it is mentioned that also the other described thermoplastic materials can be used in the form of a composite material.

A further advantage of the material PEI at least for some applications is the matter of fact that PEI can be shape formed in a reversible manner by reheating. The reason for this is that during heating (above the glass transition temperature $T_m$) there are no permanent crosslinks generated.

It is pointed out that the material PEI, PPE and potentially also PPSU may be characterized by a good adhesiveness with respect of on standard PCB materials such as resin, in particular Epoxy resin, Bismaleimide-Triazine resin, cyanate ester, glass, in particular glass fibers, prepreg material, liquid crystal polymer, epoxy-based Build-Up Film, FR4 material, a ceramic, and a metal oxide. However, for many applications also the adhesiveness of the other thermoplastic materials is sufficient in order to form a component carrier having a sufficient mechanical stability which prevents unwanted delaminations.

According to a further aspect of the invention there is provided an electronic apparatus comprising a component carrier as described above.

The provided electronic apparatus is based on the idea that the above described component carrier, which may provide a support and an electric wiring for an electronic circuit comprising one or more (surface) mounted electronic components, can be spatially adapted towards the desired shape and the size of the electronic apparatus. As a consequence, using the above described component carrier will give more freedom for designing the electronic apparatus. In particular, when relying on the spatial adaptability of the component carrier electronic apparatuses for many types of applications can be realized in a more compact design.

According to an embodiment of the invention the electronic apparatus further comprises a housing structure. Thereby, the component carrier forms at least a part of the housing structure. This may provide the advantage that the production costs for the electronic apparats can be reduced because there is no need to provide for a (complete) housing. In other words, the component carrier, which is definitely needed for building up an electronic circuit now also has the functionality to act as at least a part of the housing.

The housing structure may be any mechanical structure which allows for a safe and/or easy handling of the electronic apparatus, in particular by a human user. Further, the mechanical structure of the housing may serve to protect the interior of the electronic apparatus from unwanted or harmful external or environmental impacts.

In some applications the component carrier or a part of the component carrier may form a complete housing of the electronic apparatus, which complete housing provides for the above described functionality of handling and protection.

According to a further aspect of the invention there is provided a method for manufacturing a component carrier, in particular a component carrier as described above. The provided method comprises forming a laminated stack which includes (a) a plurality of electrically conductive layers, (b) a plurality of electrically insulating layers, and (c) a thermoplastic structure comprising a thermoplastic material.

The provided method is based on the idea that by using a thermoplastic structure as a constituent of a component carrier the three dimensional shape of the component carrier can be adapted towards various applications. Descriptive speaking, the component carrier can be tailor shaped towards a certain installation environment. It may even be possible that at least a part of the tailor shaped component carrier becomes at least a part of a housing of an electronic apparatus.

According to an embodiment of the invention forming the laminated stack comprises (a) providing a core laminate including a layer of the thermoplastic material and two electrically conductive layers sandwiching the thermo-plastic material; (b) forming the remaining electrically conductive layers and the remaining electrically insulating layers over and/or under the core laminate; and (c) creating at least one exposed portion of the layer of the thermo-plastic material.

The created exposed portion represents a predetermined area wherein the component carrier can be bent towards a desired shape. Descriptive speaking, the exposed portion may represent a hinge area which, when having an elongated form, defines a bending line for a 3D shaping the component carrier.

It is mentioned that in order to form a more complex 3D shape of the component carrier apart from elongated exposed portions slits or recesses within the component carrier may be provided. By this way a geometric net of a desired 3D component carrier shape may be provided. In this respect the geometric net of the desired 3D component carrier is an arrangement of edge-joined areas in a common plane which can be folded (along edges given by the elongated exposed portions) to become the faces of the final 3D component carrier shape.

According to a further embodiment of the invention the method further comprises (a) heating up the at least one exposed portion; and (b) bending the laminated stack within the at least one exposed portion.

Depending on the specific type of thermoplastic material the heating procedure should increase the temperature of the thermoplastic material at least up to the glass transition temperature $T_g$ (in case of an amorphous thermoplastic material) or at least up to the melting temperature $T_m$ (in case of a semi-crystalline thermoplastic material).

The heating procedure can include at least one of the following heating technologies: (a) Radiant heating, in particular by infrared (IR) radiation; (b) thermally coupling the at least one exposed portion with a heat source, e.g. a heating mat; and (c) directing a flow of a hot gas, e.g. air, towards the at least one exposed portion.

It is mentioned that although a spatial limitation of the heating procedure to the at least one exposed area would be desirable, in many applications this is not possible due to a mismatch in size between the area of the respective exposed portion and the interaction area of the respective heat source. However, this is not a big problem because the heat sustainability of the other layers of the laminated stack is sufficient in order to withstand the heat treatment of the thermoplastic material. In this respect it is recalled that typical printed circuit board (PCB) materials can withstand temperatures of more than 200° C. which occur in a typical reflow oven for soldering assembled SMD components to the respective contact pads.

According to a further embodiment of the invention the method further comprises (a) assembling active and/or passive electronic components onto the laminated stack such that they are electrically connected to the electrically conductive layers which are provided at the outside of the laminated stack; (b) heating up the at least one exposed portion; and (c) bending the laminated stack within the at least one exposed portion.

Performing an assembly process of electronic components onto the laminated stack before bending may provide the advantage the known automatic assembly routines, e.g. with automatic placement machines and/or reflow ovens, can be used. Thereby, electronic components are typically connected to predetermined connection pads which are formed at an appropriately patterned outside metal layer of the laminated stack. Thereby, the electronic components may be assembled only at one or at both sides of the laminated stack.

In this respect it is mentioned that already before bending and preferably apart from the bending region there may be provided respectively accommodated embedded electronic components within the laminated stack.

The (embedded) electronic component may be selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. However, other electronic components may be also be used. For example, a magnetic element can be used as an electronic component. Such a magnetic element may be a permanent magnetic element (such as a ferromagnetic element, an antiferromagnetic element or a ferrimagnetic element, for instance a ferrite core) or may be a paramagnetic element.

According to a further embodiment of the invention the method further comprises forming a thermosetting structure comprising a thermosetting material at the core laminate at core portions being different from the at least one exposed portion.

As has already been mentioned above the spatially selective formation of a (structured) layer of thermosetting material may allow for defining portions of the component carrier, which, after having been heated up, exhibit a permanent stiffness. Preferably, these stiff portions are those portions of the component carrier which, after a successful 3D shaping, have a planar shape.

The thermosetting structure may comprise one or more layers of thermosetting material. Preferably, with respect to the core laminate one thermosetting material layer is located above and one thermosetting material layer is located below the core laminate. Even more preferably, with respect to a symmetry plane of the core laminate, also the thermosetting structure exhibits a symmetry with respect to this plane. It is mentioned that such a symmetry can also be realized when two or even more layers of thermosetting material are provided at each side of the core laminate.

According to a further embodiment of the invention forming the thermosetting structure comprises (a) forming a release layer at the at least one exposed portion; and (b) forming the thermosetting structure also in at least one region corresponding to the at least one exposed portion; and (c) removing, within the at least one region, the thermosetting structure and in particular the release layer together with the thermosetting structure.

Preferably, the release layer is formed exclusively at the at least one exposed portion. As a consequence, outside from the at least one exposed portion the (direct or indirect) adhesion between the thermosetting structure and the core layers is not reduced. This significantly increases the mechanical stability of the final 3D shaped component carrier.

In this context the term "region corresponding to the at least one exposed portion" may particularly denote a region which, when viewed in a cross sectional plane perpendicular to the main plane (oriented parallel to the layers of the laminate), is located above or below the at least one exposed portion. In other words, when viewed along a thickness direction of the component carrier, i.e. perpendicular to the main plane being oriented parallel to the layers of the laminate, the region corresponding to the at least one exposed portion completely overlaps with the at least one exposed portion.

The release layer may comprise any material which exhibits a small adhesion to its adjacent layers. The release layer may by a print release layer such as wax.

According to a further embodiment of the invention removing, within the at least one region, the thermosetting structure comprises (a) forming, along at least one line encompassing the at least one region, a trench within the thermosetting structure such that a cut out of the thermosetting structure is formed; and (b) removing the cut out from the core laminate.

The formation of the encompassing line may be realized by any appropriate and well know (depending on the employed materials) procedures such as mechanical sawing and/or laser cutting.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

The illustration in the drawing is schematically presented. It is noted that in different Figures, similar or identical elements or features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

Further, spatially relative terms, such as "front" and "back", "above" and "below", "left" and "right", et cetera are used to describe an element's relationship to another element(s) as illustrated in the figures. Thus, the spatially relative terms may apply to orientations in use which differ from the orientation depicted in the figures. Obviously all such spatially relative terms refer to the orientation shown in the figures only for ease of description and are not necessarily limiting as an apparatus according to an embodiment of the invention can assume orientations different than those illustrated in the figures when in use.

Furthermore, it should be recognized that the following description of a currently preferred method for manufacturing a component carrier includes only a selection of method steps respectively intermediate products. For the sake of conciseness of this description some straightforward method steps respectively intermediate products are omitted.

Figure 1:
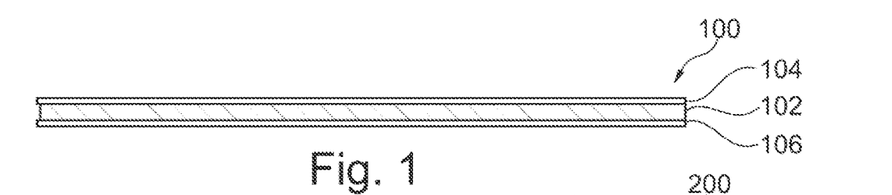
FIG. 1, FIG. 2, FIG. 3, FIG. 4, FIG. 5, FIG. 6, FIG. 7 and FIG. 8 illustrate a method for manufacturing a bent component carrier according to exemplary embodiments of the invention.

As can be seen from FIG. 1, the currently preferred method for manufacturing a component carrier in accordance with an embodiment of the invention starts with a core laminate 100. The core laminate 100 includes a core layer 102, which in this document is also denominated a thermoplastic structure. This thermoplastic structure 102 comprises a thermoplastic material. According to the embodiment described here the thermoplastic material is Polyetherimide (PEI). The core laminate 100 further comprises two electrically conductive layers 104 and 106 which are formed at two opposite surfaces of the thermoplastic material layer 102. Descriptively speaking, the core laminate 100 represents a sandwich structure wherein the core layer 102 is located in between the two electrically conductive layers 104.

According to the embodiment described here the electrically conductive layers are copper foils 104, 106 and the entire core laminate is a so called Copper Cladded Laminate (CCL) 100. This CCL 100 can be provided as a semifinished product respectively a composite layer structure.

Figure 2:
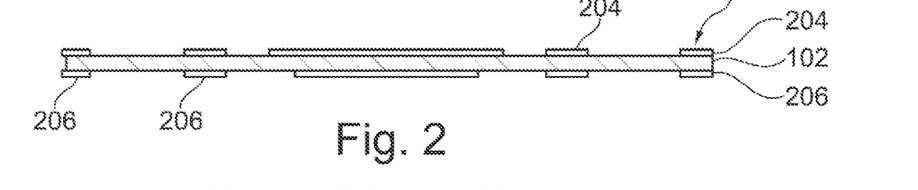

FIG. 2 shows the result of a next step of the described method for manufacturing the component carrier. The two copper foils 104, 106 have been structured respectively patterned in order to form two structured conductive layers 204 and 206. The structured conductive layers 204, 206 form an appropriate inner conductor trace pattern of the component carrier to be produced, which component carrier is a so called multi-layer component carrier having two inner structured conductive layers. The entire structure shown in FIG. 2 can be denominated a structured core laminate 200.

Figure 3:
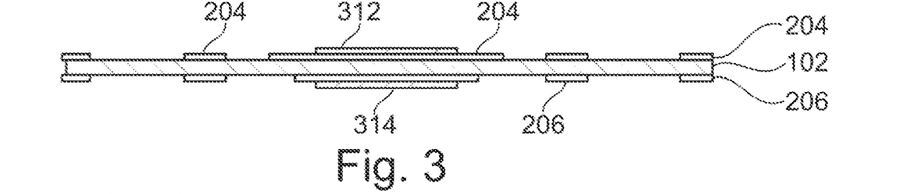

As can be seen from FIG. 3, in a next step there are formed two release layers. A first release layer 312 is formed over a center portion of the structured conductive layer 204. The second release layer 314 is formed under a center portion of the structured conductive layer 206. According to the embodiment described here a lateral dimension or size of the release layers 312, 314 is smaller than the corresponding dimension or size of the part of the structured conductive layer 204 or 206 at which the respective release layer 312 or 314 is formed. According to the embodiment described here the release layers 312, 314 are made of wax.

Figure 4:
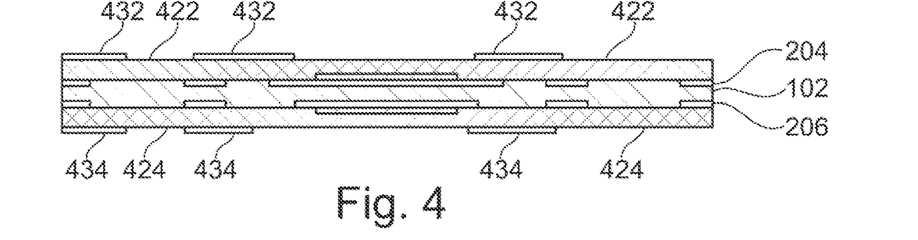

With next steps illustrated in FIG. 4, the laminate is further extended (a) by forming two thermosetting material layers and (b) by forming two further structured conductive layers 432 and 434. Specifically, a first thermosetting material layer 422 representing a first part of a thermosetting structure is formed at the top of the laminate shown in FIG. 3. Similarly, a second thermosetting material layer 424 representing a second part of the thermosetting structure is formed at the bottom of the laminate shown in FIG. 3. According to the embodiment described here the material of the thermosetting structure 422, 424 is FR4.

On top of the thermosetting material layer 422 there is formed a first further structured conductive layer 432. Accordingly, at the bottom of the thermosetting material layer 424 there is formed a second further structured conductive layer 434. According to the embodiment described here also the further structured conductive layers 432, 434 are made from copper.

Figure 5:
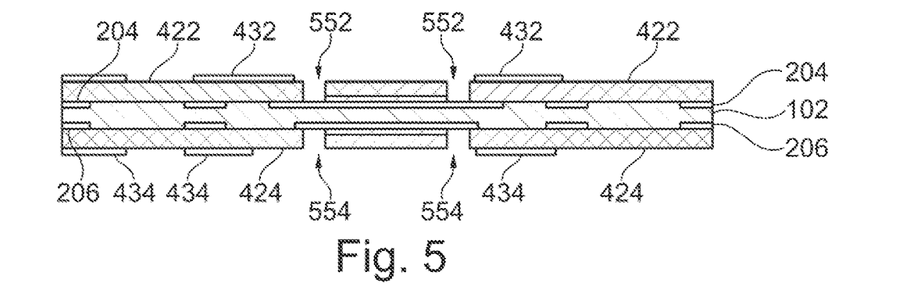

As can next be seen from FIG. 5, trenches or cuts are formed within the actually existing laminate around a portion of the thermosetting material layer 422, 424, which portion is defined by the release layer 312 respectively the release layer 314. Specifically, a first trench or cut 552 is formed in the thermosetting material layer 422 and a second trench or cut 554 is formed in the thermosetting material layer 424. According to the embodiment described here the trenches or cuts 552, 554 are formed by laser cutting.

Figure 6:
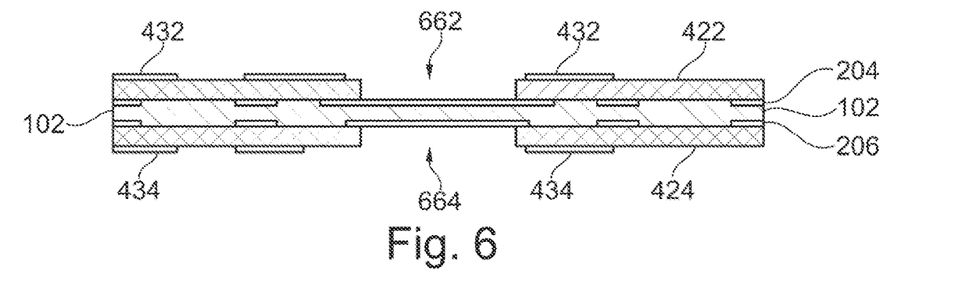

Next, as can be seen from FIG. 6, the previously formed cut out portions of the thermosetting material layers 422 and 424 together with the corresponding release layers 312 and 314, respectively, are removed. Thereby, the exposed portions are formed. Specifically, a first exposed portion 662 is formed at the upper side of the remaining laminate and a second exposed portion 664 is formed at the lower side of the remaining laminate.

Figure 7:
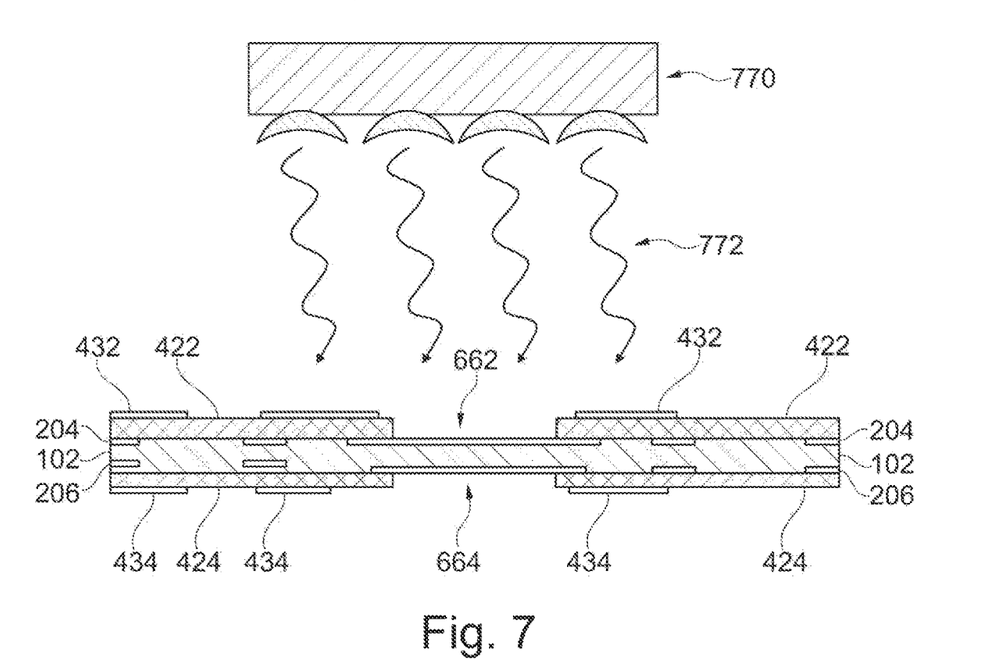

As can be seen from FIG. 7, the method for manufacturing the (multi-layer) component carrier continues with heating up the laminate structure shown in FIG. 6. According to the embodiment described here an electromagnetic radiation heating device 770 is employed, which emits IR radiation 772 towards the exposed portion 662.

In this respect it is mentioned that according to the embodiment described here only one heating device 770 is employed. However, it should be clear for a person skilled in the art that of course the further heating device may be employed which irradiates the exposed portion 664 from the bottom.

Since the remaining thermosetting structure 422, 424 shields most of the thermoplastic material layer 102 the (center) portion of the thermoplastic material layer 102 is heated up much more than the outer portion of the thermoplastic material layer 102. As a consequence, the laminate becomes mechanically flexible in particular within the area corresponding to the exposed portions 662, 664. Descriptively speaking, the exposed portions 662, 664 define a hinge region of the laminate shown in FIGS. 6 and 7.

Figure 8:
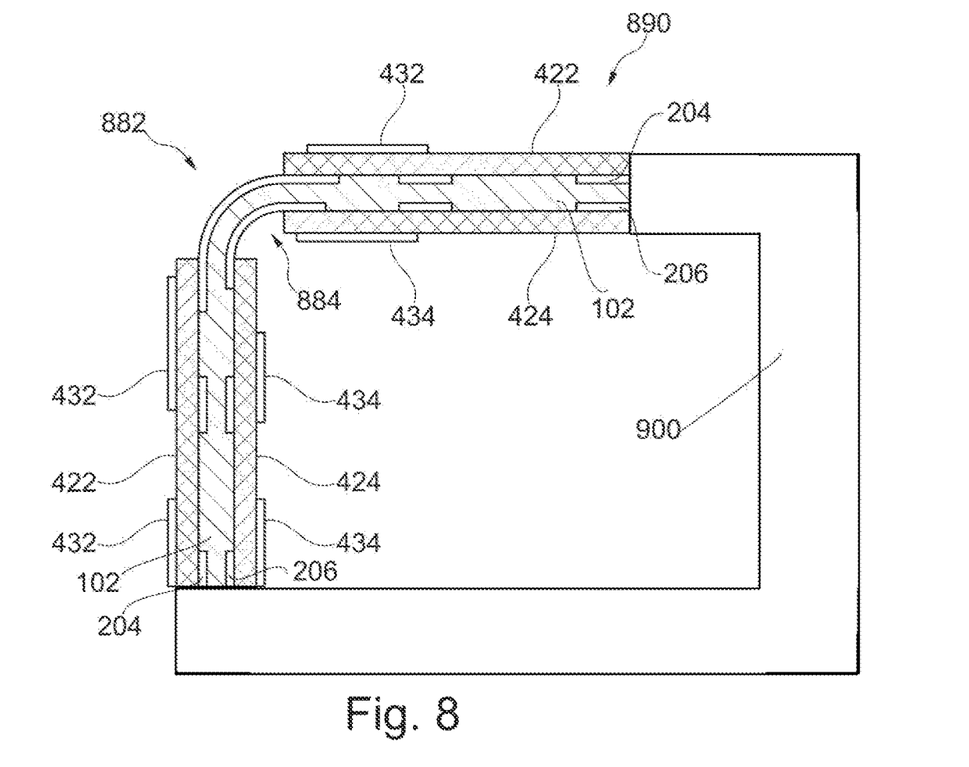

As can be seen from FIG. 8, in a next step the laminate is bent. According to the embodiment described here a right angle is established between (a) the (former) left side of the laminate and (b) the right side of the laminate shown in FIGS. 6 and 7. By this way the final component carrier 890 is formed, which has undergone a 3D shape forming. Since within the exposed portions 662, 664 the flexibility of the laminate is comparatively high (when heated up), the right angle bending of the laminate results in a spatially restricted bent portion 882, 884, wherein reference numeral 882 denominates an outer side of the bent portion and the reference numeral 884 denominates an inner side of the bent portion.

In FIG. 8 on the right side of the component carrier 890 (below the horizontal portion) there may be the interior of the housing structure 900. Accordingly, on the left side and on the upper side of the component carrier 890 there may be the exterior of the housing structure 900.

It is pointed out that it is of course also possible that more exposed portions each corresponding to one possible hinge can be formed. Depending on the desired final 3D-shape of the component carrier 890 two or even more hinges could be formed (at each side) of the (flat) laminate.

Figure 9:
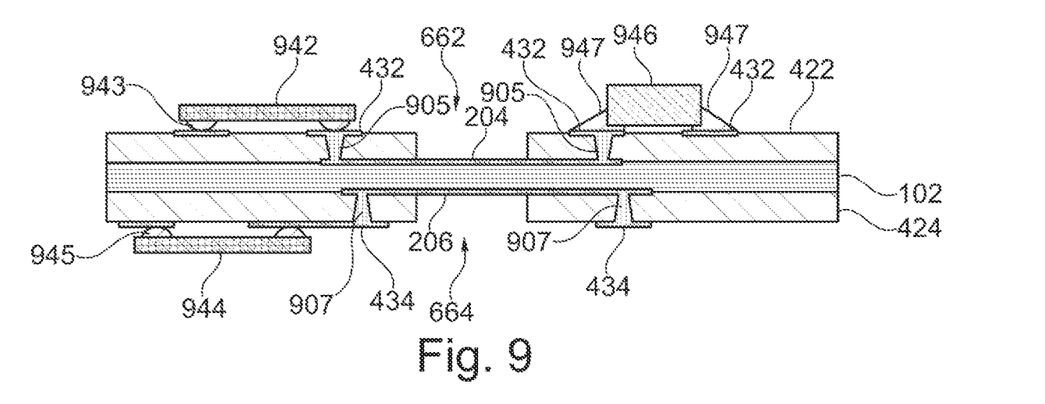
FIG. 9, FIG. 10, FIG. 11 and FIG. 12 illustrate a method for manufacturing a bent electronic assembly formed on a component carrier wherein before bending the component carrier electronic components are placed onto the component carrier according to exemplary embodiments of the invention.

FIG. 9 illustrates an intermediate step for forming manufacturing a bent electronic assembly. By contrast to the illustration shown in FIG. 6 electronic components 942, 946, and 944 are assembled onto the upper surface of the thermosetting material layer 422 respectively onto the lower surface of the thermosetting material layer 424. In order to be more precise the electronic components 942 and 944 are connected to the structured conductive layer 432 respectively to the structured conductive layer 434. Metallic interconnections realized by metallized vias or studs 905 electrically connect the structured conductive layer 204 with the structured conductive layer 432 with which appropriate connection pads for the electronic components 942 and 946 are formed. Correspondingly, metallic interconnections realized by metallized vias or studs 907 electrically connect the structured conductive layer 206 with the structured conductive layer 434 with which appropriate connection pads for the electronic component 944 are formed.

As can be seen from FIG. 9, according to the embodiment described here the electronic components 942 and 944 are so called ball grid arrays, which, in a known manner, are electrically connected to the structured conductive layer 432 and to the structured conductive layer 434, respectively, by means of solder balls 943 and solder balls 945, respectively. Further, in the illustrated embodiment the electronic component 946 is a simple double-pole component such as a resistor or a capacitor. The electric terminals of the electronic component 946 are formed in a known manner at side surfaces, which are electrically connected to the structured conductive layer 432 by means of solder material 947. In this respect it is mentioned that the assembly shown in FIG. 9 has undergone not only a placement procedure, wherein the electronic components 942, 946, and 944 are placed on the upper respectively lower surface of the laminate structure comprising the core material 102, the two structured conductive layers 204, 206, the two thermosetting material layers 422, 424, and the two structured conductive layers 432, 434, but also a reflow procedure, wherein solder paste is melted and solidified in order to permanently electrically connect the electronic components 942, 946, and 944 with the respective connection pads.

Figure 10:
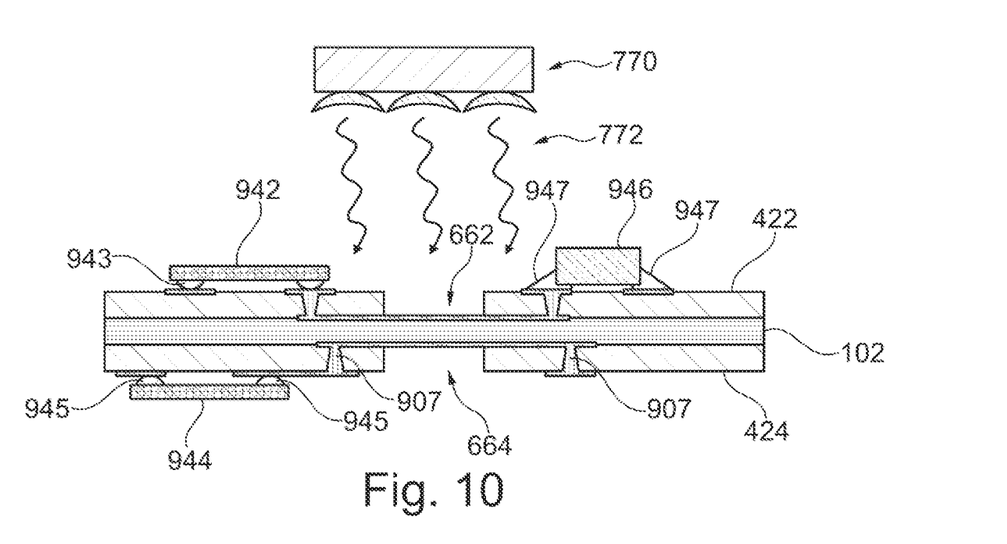

FIG. 10 illustrates, in accordance with FIG. 7, a possible procedure for heating up the laminate structure shown in FIG. 9 having the electronic components 942, 944, and 946 permanently mounted at the top respectively at the lower surface of the laminate structure.

Figure 11:
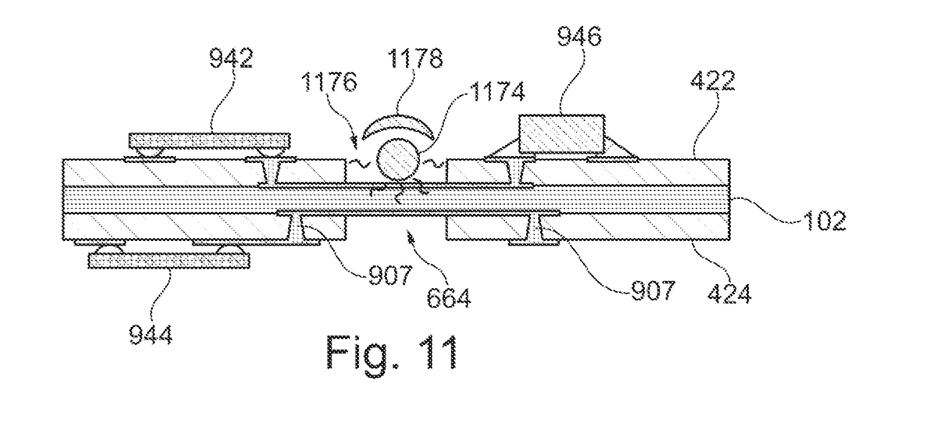

FIG. 11 illustrates a further possible procedure for heating up the laminate structure shown in FIG. 9. Instead of the heating device 770 now a heating wire 1174 is employed in order to emit IR radiation 1176 being responsible for the heat introduction into the thermoplastic material layer 102. A reflector 1178 is used in order to "focus" the IR radiation 1176 onto the thermoplastic material layer 102.

It is mentioned that in addition to the heating wire 1174 also a non-depicted for the heating wire could be employed, which emits IR radiation to the thermoplastic material layer 102 from the bottom. Additionally it is possible to apply the heat also by a contact heating device which transfers the heat rather by heat conduction than radiation.

Figure 12:
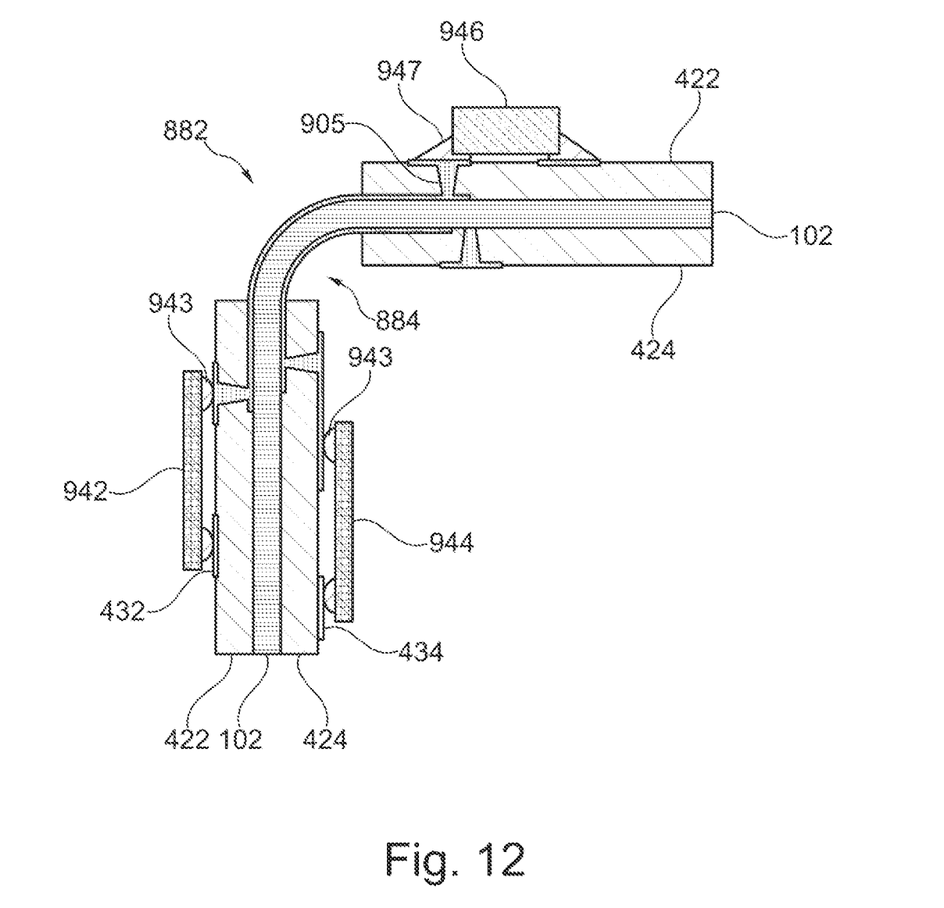

As can be seen from FIG. 12, in a next step the laminate being populated with the electronic components 942, 946, and 944 is bent. In accordance with FIG. 8, also here a right angle is established between (a) the (former) left side of the laminate and (b) the right side of the laminate shown in FIGS. 9, 10, and 11. It should be clear that during the bending process the thermoplastic material layer 102 should have a sufficiently high temperature at least within the hinge regions 882, 884 in order to avoid an unwanted breakage of the thermoplastic material layer 102. After cooling down the hinge regions 882, 884 will permanently stay in the deformed respectively bent structural shape.

It should be noted that the term "comprising" does not exclude other elements or steps and the use of articles "a" or "an" does not exclude a plurality. Also elements described in association with different embodiments may be combined.

LIST OF REFERENCE SIGNS

100 core laminate/Copper Cladded Laminate (CCL)
102 core layer/thermoplastic structure/thermoplastic material layer
104 electrically conductive layer/copper foil
106 electrically conductive layer/copper foil
200 structured core laminate
204 structured conductive layer
206 structured conductive layer
312 release layer/wax
314 release layer/wax
422 thermosetting structure/thermosetting material layer
424 thermosetting structure/thermosetting material layer
432 structured conductive layer
434 structured conductive layer
552 trenches/cuts
554 trenches/cuts
662 exposed portion
664 exposed portion
770 heating device
772 IR radiation
882 bent portion/hinge region (outer side)
900 housing structure
884 bent portion/hinge region (inner side)
890 component carrier (3D shaped)
905 metallic interconnection/stud
907 metallic interconnection/stud
942 electronic component/ball grid array
943 solder balls
944 electronic component/ball grid array
945 solder balls
946 electronic component/double-pole component
947 solder material (after reflow procedure)
1174 heating wire
1176 IR radiation
1178 IR reflector

The invention claimed is:

1. A component carrier for carrying at least one electronic component, the component carrier comprising:
a plurality of electrically conductive layers,
a plurality of electrically insulating layers forming thermosetting structures, and
a thermoplastic structure comprising a thermoplastic material;
wherein the electrically conductive layers, the electrically insulating layers, and the thermoplastic structure form a laminate,
wherein the thermosetting structure comprises a thermosetting material;
wherein the thermosetting structure is formed over and under the thermoplastic structure such that the thermoplastic structure forms a core layer, and
wherein, with respect to a main plane being oriented parallel to the layers of the laminate, the thermosetting structure comprises a smaller size than the thermoplastic structure, such that there is at least one exposed portion in which only the thermoplastic structure and not the thermosetting structure is provided,
wherein the exposed portion is not covered with the thermosetting structure over and under the exposed portion of the thermoplastic structure,
wherein the thermoplastic structure forming the core layer is rigid and bent over the exposed portion.

2. The component carrier as set forth in claim 1, wherein the thermoplastic material is included in a composite layer structure.

3. The component carrier as set forth in claim 1, wherein the thermoplastic structure is a core laminate comprising a layer of the thermoplastic material which is sandwiched by two electrically conductive layers.

4. The component carrier as set forth in claim 1, wherein the thermoplastic material is a semi-crystalline material or an amorphous material.

5. The component carrier as set forth in claim 1, wherein the thermoplastic material comprises at least one of the group consisting of Polyolefins such as Polypropylene (PP), Vinyl-Polymers such as PVC, Styrene based Polymers such as Polystyrene (PS), Polyacrylates such as Polymethylmetaclylate (PMMA), Polyacetals such as Polyoxymetlylene (POM), Fluoropolymers such as Polytetrafluoroethylene (PTFE), Polyamides including aromatic polyamides such as Polyphthalamide (PPA), Polycarbonate (PC) and Derivatives, Polyesters such as Polyethylene terephthalate (PET), Liquid Crystalline Polymers (LCP), Polyarylether such as Polyphenyleneether (PPE), Polyphenylenesulfone (PSU), Polyphenylenesulfone (PSU), Polyarylethersulfone (PES), Polyphenylensulfid (PPS), Polyetherketones such as Polyetheretherketone (PEEK), Polyimide (PI), Polyetherimide (PEI), Polyamidimide (PAI).

6. An electronic apparatus, comprising:
a component carrier including:
a plurality of electrically conductive layers,
a plurality of electrically insulating layers forming thermosetting structures, and
a thermoplastic structure comprising a thermoplastic material;
wherein the electrically conductive layers, the electrically insulating layers, and the thermoplastic structure form a laminate,
wherein the thermosetting structure comprises a thermosetting material;
wherein the thermosetting structure is formed over and under the thermoplastic structure such that the thermoplastic structure forms a core layer, and
wherein, with respect to a main plane being oriented parallel to the layers of the laminate, the thermosetting structure comprises a smaller size than the thermoplastic structure, such that there is at least one exposed portion in which only the thermoplastic structure and not the thermosetting structure is provided,
wherein the exposed portion is not covered with the thermosetting structure over and under the exposed portion of the thermoplastic structure,
wherein the thermoplastic structure forming the core layer is rigid and bent over the exposed portion.

7. The electronic apparatus of claim 6, further comprising:
a housing structure, wherein the component carrier forms at least a part of the housing structure.

8. A method for manufacturing a component carrier, the method comprising:
forming a laminated stack including a plurality of electrically conductive layers, a plurality of electrically insulating layers forming thermosetting structures, and a thermoplastic structure comprising a thermoplastic material, wherein the thermosetting structure comprises a thermosetting material over and under the thermoplastic structure, wherein, with respect to a main plane being oriented parallel to the layers of the laminate, the thermosetting structure comprises a smaller size than the thermoplastic structure, wherein within the main plane there is at least one exposed portion in which only the thermoplastic structure and not the thermosetting structure is provided, wherein the exposed portion is not covered with the thermosetting structure over and under the exposed portion of the thermoplastic structure, wherein the thermoplastic structure forming the core layer is rigid and bent over the exposed portion.

9. The method as set forth in claim 8, wherein forming the laminated stack comprises
providing a core laminate including a layer of the thermoplastic material and two electrically conductive layers sandwiching the thermoplastic material, and
forming the remaining electrically conductive layers and the remaining electrically insulating layers over and under the core laminate.

10. The method as set forth in claim 9, further comprising:
heating up the at least one exposed portion.

11. The method as set forth in claim 10, further comprising:
assembling active and/or passive electronic components onto the laminated stack such that they are electrically connected to the electrically conductive layers which are provided at the outside of the laminated stack.

12. The method as set forth in claim 9, further comprising:
forming the thermosetting structure comprising the thermosetting material at the core laminate at core portions being different from the at least one exposed portion.

13. The method as set forth in claim 12, wherein forming the thermosetting structure comprises
forming a release layer at the at least one exposed portion, and
forming the thermosetting structure also in at least one region corresponding to the at least one exposed portion; and
removing, within the at least one region, the thermosetting structure and the release layer together with the thermosetting structure.

14. The method as set forth in claim 13, wherein removing, within the at least one region, the thermosetting structure comprises
forming, along at least one line encompassing the at least one region, a trench within the thermosetting structure such that a cut out of the thermosetting structure is formed; and
removing the cut out from the core laminate.

* * * * *